United States Patent [19]

Hillman et al.

[11] Patent Number: 4,496,180

[45] Date of Patent: Jan. 29, 1985

[54] VACUUM HANDLING APPARATUS

[75] Inventors: Joseph T. Hillman, Cincinnati; Michael B. Miller, Milford, both of Ohio

[73] Assignee: Cincinnati Milacron Industries, Inc., Cincinnati, Ohio

[21] Appl. No.: 515,573

[22] Filed: Jul. 20, 1983

[51] Int. Cl.³ .............................................. B66C 1/02
[52] U.S. Cl. ..................................... 294/64 R; 271/90
[58] Field of Search ................. 294/64 R, 64 A, 64 B, 294/65; 29/743; 271/90, 93, 107, 132; 414/114, 121, 752

[56] References Cited

U.S. PATENT DOCUMENTS

| | | | |
|---|---|---|---|
| 1,460,314 | 6/1923 | Deck | 294/64 R X |
| 1,519,243 | 12/1924 | Ericsson | 294/65 |
| 1,996,385 | 4/1935 | Owen | 294/65 X |
| 2,396,988 | 3/1946 | Cutler | 271/132 X |
| 2,807,029 | 9/1957 | Armstrong | 294/64 R X |
| 3,539,216 | 11/1970 | Forcier | 294/64 B |
| 3,843,183 | 10/1974 | Hutson | 294/64 R |
| 3,997,210 | 12/1976 | Jay | 294/81 R |
| 4,002,254 | 1/1977 | Olofsen | 294/64 B X |
| 4,050,729 | 9/1977 | Hutson | 294/64 R |

OTHER PUBLICATIONS

IBM Technical Disclosure Bulletin, vol. 19, No. 11, Apr. 1977, pp. 4175-4176, "Unloading Tool for Wafers", Clark et al.

IBM Technical Disclosure Bulletin, vol. 24, No. 6, Nov. 1981, pp. 3017-3018, "Vacuum Wafer Pick-Up Tip", Ferrentino et al.

Primary Examiner—Johnny D. Cherry
Attorney, Agent, or Firm—Donald Dunn

[57] ABSTRACT

A vacuum operated apparatus is provided for releasably grasping and transporting a thin solid object or article (e.g. silicon semiconductor wafer). The apparatus has two fixed rigid arms joined together at their rear end to define a gap therebetween having an open end and closed end wherein the upper arm directs the thin solid object into the gap and toward the lower arm having a port communicating with the gap and an enclosed passage way connected to a vacuum source. A vacuum applied to the lower arm holds the object against the grasping surface of the lower arm. Silicon semiconductor wafers may be grasped and transported with the apparatus and more especially silicon semiconductor wafers can be deposited onto and removed from the surface of a barrel type susceptor of an epitaxial reactor with enhanced ease and reduced danger of scratching and breaking the wafer.

7 Claims, 11 Drawing Figures

VACUUM HANDLING APPARATUS

BACKGROUND OF THE INVENTION

This invention relates to a vacuum activated apparatus for picking up, releasably grasping and transporting a thin solid object such as a semiconductor wafer. Further, this invention relates to a vacuum activated apparatus, for releasably grasping a single crystal silicon semiconductor wafer, having a guiding element for controlling and directing the wafer to the grasping surface of the apparatus.

It is well known that in industrial processes the grasping, transport and manipulation of small, thin, flat objects can present numerous problems. This is especially true in the electronics industry and even more especially true in the semiconductor industry. Single crystal silicon semiconductor wafers, used to make integrated circuit chips for watches, calculators, instruments and other devices, are thin and brittle. They are easily broken and their surfaces are especially susceptible to scratches and contamination. Such scratches and contamination destroy the usefulness of the wafer for integrated circuit manufacture. Thus, the wafer must be handled with care during its production and subsequent processing into integrated circuit chips. Further, breakage, scratching and contamination of the wafer reduce the yield of the wafer manufacturer. This reduced yield, of course, increases the cost of the wafer. It is thus important to have a handling apparatus that does not break, scratch or contaminate the wafer and yet permits the easy, rapid pick up and handling of the wafer.

A number of steps are employed in the manufacture of a single crystal silicon semiconductor wafer starting with the single crystal silicon rod from which the wafer is cut. The wafer is, during its manufacture, lapped or ground to a uniform thickness and flat surfaces. One flat surface is then polished, and the wafer is cleaned, etched and cleaned again. In many instances, an epitaxial layer of single crystal silicon is then desposited on the polished surface of the wafter at an elevated temperature. This deposition usually occurs from the vapor phase on to the wafer surface generally at a temperature of about 1000° C. to 1300° C. In many of the modern reactors for the elevated temperature vapor deposition of the single crystal silicon epitaxial layer onto the surface of the silicon wafer, the wafer is held in a substantially vertical position on the surface of a rotatable graphite drum or barrel known as a susceptor. This configuration permits a larger number of wafers to be processed in the reactor at one time than is possible with a horizontal placement of the wafers in a reactor of the same size. The surface of the drum is inclined slightly and has depressions into which the wafers fit. This inclination is just sufficient to prevent the wafers from falling out of the depressions in the surface of the drum or barrel susceptor. To remove the wafer from the surface of the barrel type susceptor the wafer must be tipped forward from the base of the depression in which it sits and at the same time be grasped at its rear surface to prevent the wafer from falling from the susceptor and breaking. The removal of the wafer from the susceptor is usually done while the susceptor and wafer are still very warm or hot, e.g. 200° to 300° C. This improves reactor utilization since there is no waiting for the reactor to cool to room temperature before removing the wafers and reloading the reactor. Metal tweezers have been used to remove the hot wafer from the susceptor because of their resistance to heat, however, they tend to (1) scratch the epitaxial layer and the opposite face of the silicon semiconductor wafer and (2) contaminate the epitaxial layer and the opposite face of the wafer. To overcome the problems with metal tweezers, plastic tipped metal tweezers and even plastic tweezers have been tried and found to be undesirable not only because they also may contaminate the epitaxial layer and the opposite side of the wafer but they also are found to have insufficient resistance to the heat present in the wafer. These mechanical metal and plastic tweezers also make it difficult to tip the wafer away from the barrel type susceptor and grasp it before the wafer falls from the susceptor. Quartz tip vacuum pencils as are used in the art to pick up a wafer from a horizontal surface or remove a wafer from a storage tray or rack have also been found to be not entirely suitable for removing wafers from a barrel type susceptor because the insertion of the flat spatula like or wedge shaped quartz tip between the wafer and the surface of the barrel type susceptor moves the wafer away from the susceptor far enough to allow the wafer to fall from the susceptor before the wafer can be grasped by the tip by applying a vacuum. Thus, prior art apparatus for grasping and handling semiconductor wafers have not been found to be entirely suitable for placing wafers on and removing wafers from a barrel type susceptor of an epitaxial ractor.

It is an object of this invention to provide an apparatus to releasably grasp a semiconductor wafer while avoiding scratching, contaminating or otherwise damaging the wafer.

Another object of this invention is to provide an apparatus to releasably grasp a semiconductor wafer or other thin solid article to safely lift the wafer or article from a surface.

A still further object of this invention is to provide an apparatus to remove a semiconductor wafer from a vertical susceptor surface.

An even further object of this invention is to provide an apparatus wherein a means is provided to guide and direct a semiconductor wafer or other thin solid article toward and on to a grasping surface to releasably grasp the wafer or the article under vacuum for lifting, transporting or depositing the wafer or article, without contacting the front surface.

These and other objects of this invention will become apparent from the following more detailed description.

SUMMARY OF THE INVENTION

There is now provided in accordance with this invention an apparatus for releasably grasping a thin solid article, such as for example, a single crystal silicon semiconductor wafer, which overcomes many of the problems encountered with the use of prior art vacuum pencils or other devices for releasably grasping semiconductor wafers. This invention provides an apparatus, for releasably grasping a thin solid article, comprising a rigid upper arm and a rigid lower arm that are rigidly joined together at one end and spaced apart at the other end to define a closed end gap therebetween wherein the lower arm has a port which communicates with the gap and with an enclosed passageway for connection to a vacuum source.

DETAILED DESCRIPTION OF THE INVENTION

Figure 1:
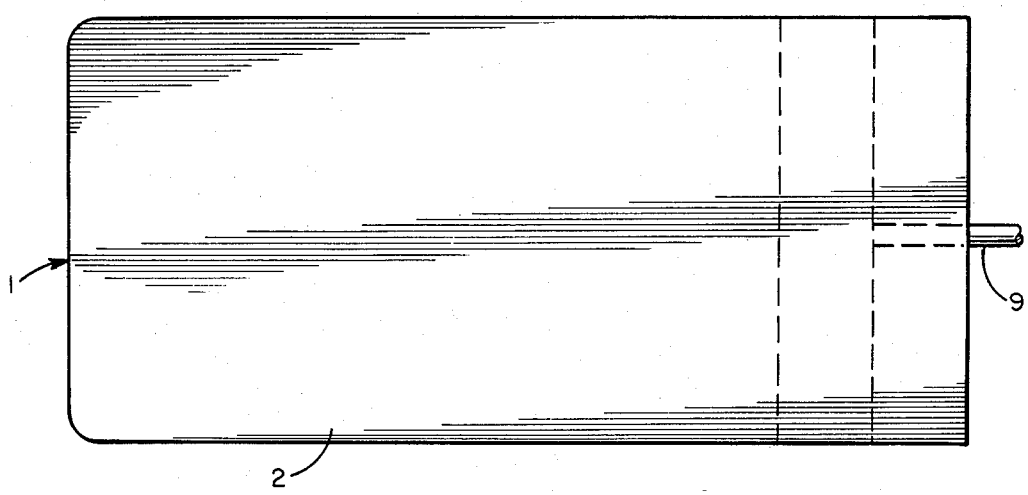
FIGS. 1, 2 and 3 are the top planar view, side elevation view and bottom planar view respectively of one embodiment of the apparatus of this invention.
Figure 2:
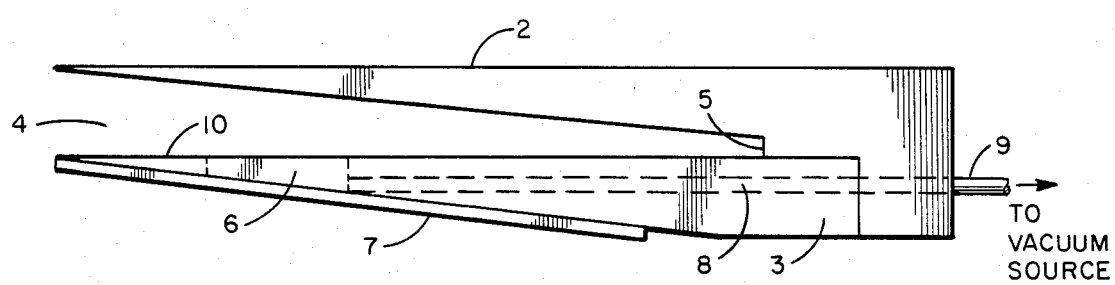
Figure 3:
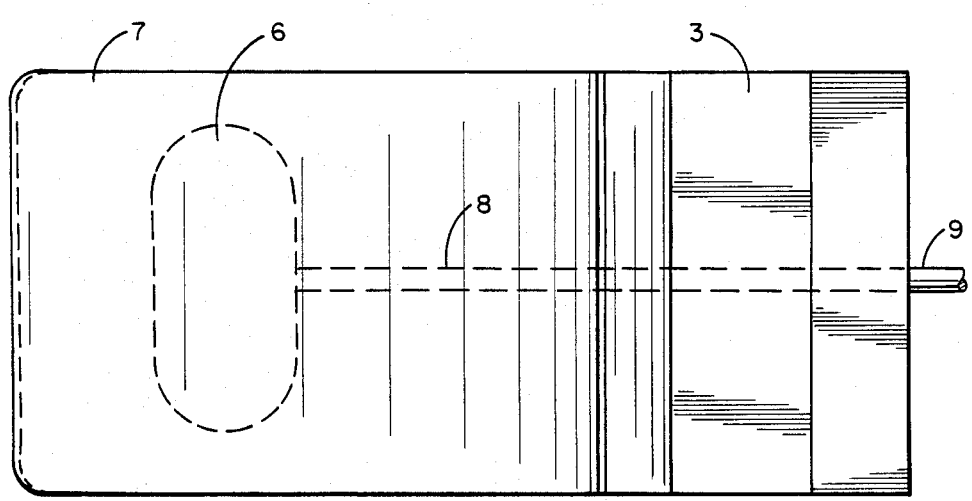

In FIGS. 1, 2 and 3 there are shown the top planar view, side elevation view and bottom planar view respectively of an apparatus 1 according to this invention. The apparatus 1 has an upper arm 2 and a lower arm 3 rigidly joined together, as for example by adhesive bonding, fusing or a mechanical fastener, at the rear end to form an angular gap 4 open at its sides and at its forward end and having a closed rear end defined by vertical surface 5 in upper arm 2. The gap 4 has a greater vertical distance at its open forward end than at its rear closed end. Lower arm 3 has a port 6, open at the upper surface 10 of lower arm 3 and closed at its opposite end by plate 7 fixed to the bottom of lower arm 3, communicating with gap 4 and enclosed passageway 8 in lower arm 3. Passageway 8 is joined to conduit 9 which is connected to a vacuum source, not shown. Preferably port 6 is located forward of the mid point of the longitudinal dimension of lower arm 3.

The apparatus according to this invention is especially useful and advantageous for depositing a semiconductor wafer on to and removing a semiconductor wafer from the substantially vertical surface of a barrel or drum type susceptor of an epitaxial reactor. Many of the reactors employed to deposit an epitaxial film or layer on to the surface of a semiconductor wafer (e.g. deposit a silicon layer on the surface of a monocrystalline silicon wafer) use a drum or barrel type susceptor to hold the wafer during the elevated temperature (e.g. 1000° to 1300° C.) vapor deposition of the epitaxial layer. The barrel or drum type susceptor, advantageous because it can hold a large number of wafers and, therefore, can process a large number of wafers in the reactor at the same time, has a slightly conical configuration with circular depressions having a flat bottom for holding the wafers. Depositing a wafer into the depression and removing a wafer from the depression without dropping or otherwise damaging the wafer is a tricky operation with prior art vacuum devices for grasping the wafer, especially the vacuum wand or spatula like devices. The wafer must be presented to or canted away from the rear surface of the depression at an angle while resting the wafer on the lip of the depression. With prior art vacuum grasping devices often times the angle formed between the wafer and the rear surface of the depression must be so great for manipulating the vacuum grasping device, which grasps the rear surface of the wafer, that when the wafer is released from the device to allow the wafer to fall back into the depression or before the vacuum port of the grasping device can be properly positioned to grasp the wafer, the wafer falls from the lip of the depression damaging the wafer. In removing a wafer from the depression in the surface of the barrel or drum type susceptor the wafer must be tilted forward from the rear of the depression by inserting the prior art vacuum wand or spatula like grasping device between the wafer and the rear of the depression far enough for the vacuum port of the grasping device to be properly positioned on the wafer. However, before the wand or spatula like grasping device has been inserted far enough to grasp the wafer, the wafer has been moved out far enough for it to fall from the lip of the depression and thereby damage the wafer.

Figure 4:
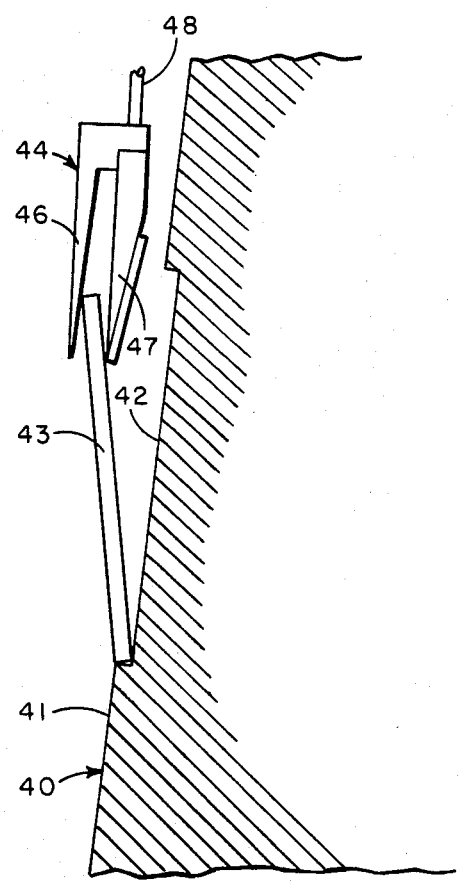
FIG. 4 illustrates a manner in which an apparatus according to this invention may be employed to grasp and remove from or deposit on a substantially vertical surface a thin solid article, such as for example a wafer.
Figure 5:
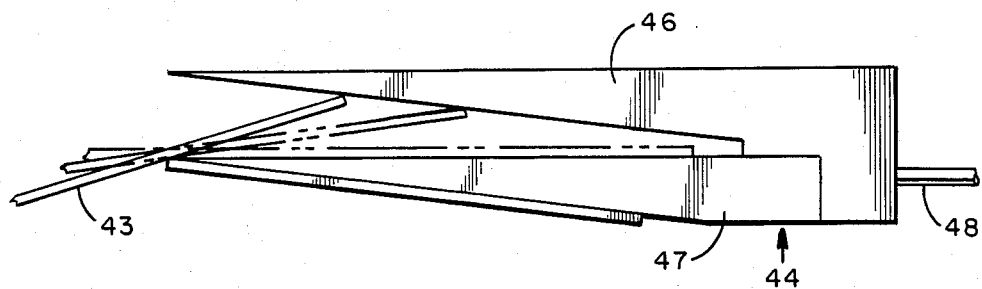
FIG. 5 is a side view of an apparatus according to this invention showing the self guiding feature of the invention for guiding and directing of a thin solid article, such as a semiconductor wafer, into the apparatus for grasping by the apparatus.

FIG. 4 shows the advantageous use of an apparatus 44 according to this invention, overcoming the problems of prior art vacuum grasping devices, for depositing a semiconductor wafer onto and removing a semiconductor wafer from the substantially vertical face of a barrel type susceptor of an epitaxial reactor. In FIG. 4 is shown the removal of a semiconductor wafer from the depression in the surface of a barrel type susceptor. Lower arm 47 of the apparatus 44 according to this invention has been inserted between the rear surface of wafer 43 and the rear wall 42 of the depression in surface 41 of the barrel susceptor 40, shown in broken away partial section, and wafer 43 moved away from wall 42. As lower arm 47 of apparatus 44 is inserted further behind wafer 43 the wafer 43 enters the gap between upper arm 46 and lower arm 47 of apparatus 44. The upper arm 46 prevents the wafer 43 from tilting out even further while guiding and directing the wafer 43 into the gap and toward lower arm 47. Lower arm 47 has a port, not shown, communicating with the gap between arm 46 and 47 and with an enclosed passageway, not shown, in arm 47 which is connected to conduit 48. In turn conduit 48 is attached to a vacuum source. While wafer 43 is feeding into the gap between arm 46 and arm 47 and directed by arm 46 toward arm 47 a vacuum is applied to apparatus 44 through conduit 48, the enclosed passageway, not shown, in arm 47 and the port, not shown, in arm 47. When the wafer 43 has been directed close enough to the port, not shown, in arm 47 the vacuum forces wafer 43 against arm 47 thereby grasping wafer 43 for removal from the surface 41 of the barrel type susceptor 40. The movement of wafer 43 into the gap between upper arm 46 and lower arm 47 of apparatus 44 and the directing of wafer 43, by arm 46, toward arm 47 is shown in greater detail in FIG. 5.

Figure 6:
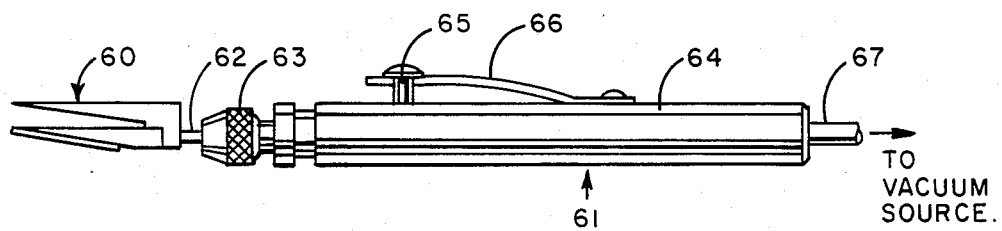
FIG. 6 a side view showing an apparatus according to this invention attached to a handle.

There is shown in FIG. 6 an apparatus 60, according to this invention, attached to a commercially available vacuum handle 61 by means of conduit 62 grasped by collet chuck 63 fixed to body 64 of handle 61. Body 64 has a valve 65, attached thereto by a leaf spring 66, for controlling the vacuum to apparatus 60. Handle 61 is connected to a vacuum source, not shown, by means of a tube 67 at the rear end of body 64. Handle 61 does not form a part of this invention.

Figure 7:
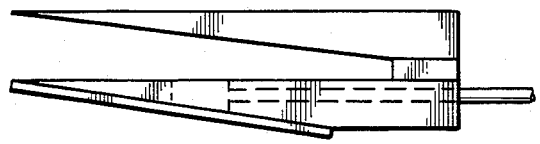
FIGS. 7, 8 and 9 are side views of alternate embodiments of this invention.
Figure 8:
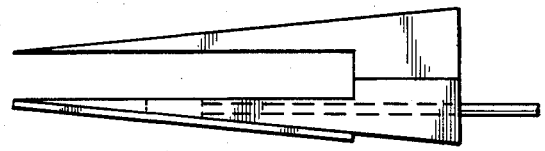
Figure 9:
Figure 10:
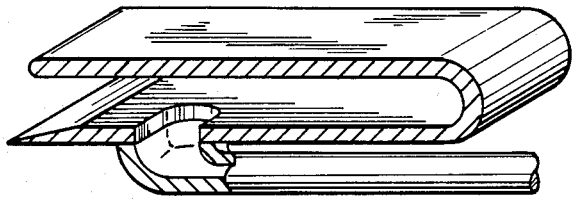
FIGS. 10 and 11 are isometric views, partially in cross section, of further embodiments of this invention.
Figure 11:
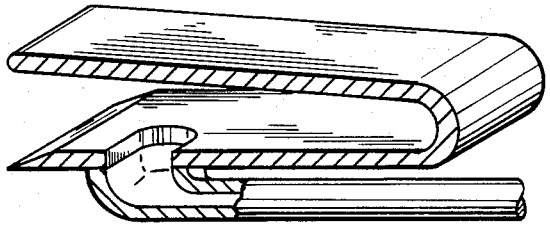

Various embodiments of the apparatus according to this invention are shown, in side elevation view, in FIGS. 7, 8 and 9. Still further embodiments of the apparatus according to this invention are illustrated, in isometric views partially in section in FIGS. 10 and 11.

The apparatus according to this invention may be constructed of various materials, preferably rigid materials, including but not limited to metals (e.g. steel and aluminum), plastics (e.g. polyimide, polycarbonate, nylon and Teflon), quartz and silicon. Thus, use of the apparatus according to this invention in semiconductor processes requires that the material of construction does not contaminate the semiconductor articles and preferably that the material of construction be resistant to elevated temperatures (e.g. 200° to 300° C.). As examples of such materials of construction there include quartz, silicon and polyimide.

Although this invention has been described with respect to its use for handling semiconductor wafers more particularly the depositing a semiconductor wafer onto and the removal of a semiconductor wafer from the substantially vertical surface of a barrel type susceptor of an epitaxial reactor this invention may be used also to pick up semiconductor wafers or other thin solid articles from a horizontal surface or to deposit a semiconductor wafer or other thin solid article onto a horizontal surface. This invention may even be used to remove wafers from or insert wafers into a slotted tray or other container. Thus, this invention finds wide utility in lifting, transporting and depositing thin solid articles.

There is provided in accordance with this invention an apparatus for releasably grasping a thin solid article, such as for example, a mono-crystalline semiconductor wafer, comprising in fixed relation to each other a rigid upper arm and a rigid lower arm, each arm having a forward end and a rear end, wherein said upper arm and said lower arm are rigidly joined together at their rear ends to define a closed end gap therebetween having two open sides and an open forward end for receiving the article and the lower arm having a port that communicates with the gap and with an enclosed passageway for connection to a vacuum source.

While this invention has been described in conjunction with specific embodiments thereof, it is to be understood that many alternatives, modifications and variations will be apparent to those skilled in the art in light of the foregoing description. Accordingly, it is intended to embrace all such alternatives, modifications and variations as fall within the spirit and scope of the appended claims.

The preferred practice of the apparatus according to this invention is shown in FIG. 9.

What is claimed is:

1. An apparatus for releasably grasping a thin solid article comprising in fixed relation to each other a rigid upper arm and a rigid lower arm each arm having a forward end and a rear end, wherein the upper arm and the lower arm are rigidly joined together at their rear ends to define a closed end gap therebetween having two open sides and an open forward end for receiving said article and the lower arm having a port that communicates with the gap and with an enclosed passageway for connection to a vacuum source for releasably grasping said article.

2. An apparatus according to claim 1 wherein the lower arm contains the enclosed passageway.

3. An apparatus according to claim 1 wherein the upper arm and the lower arm are each tapered toward their forward end.

4. An apparatus according to claim 1 wherein the forward end of the lower arm extends forward of the forward end of the upper arm.

5. An apparatus according to claim 1 wherein the upper arm is contiguous with the lower arm.

6. An apparatus according to claim 1 wherein the lower arm has the port located forward of the mid point of the longitudinal dimension of the lower arm.

7. An apparatus according to claim 1 wherein the lower arm contains the enclosed passageway, the upper arm and the lower arm are each tapered toward their forward end and the lower arm has the port located forward of the mid point of the longitudinal dimension of the lower arm.

* * * * *